United States Patent
Germain et al.

(10) Patent No.: US 9,934,338 B2
(45) Date of Patent: Apr. 3, 2018

(54) METHODS AND RELATED SYSTEMS OF BUILDING MODELS AND PREDICTING OPERATIONAL OUTCOMES OF A DRILLING OPERATION

(71) Applicant: Landmark Graphics Corporation, Houston, TX (US)

(72) Inventors: Olivier Germain, Houston, TX (US); Keshava P. Rangarajan, Sugar Land, TX (US); Amit K. Singh, Houston, TX (US); Hermanus Teunissen, Houston, TX (US); Ram N. Adari, Katy, TX (US)

(73) Assignee: LANDMARK GRAPHICS CORPORATION, Houston, TX (US)

( * ) Notice: Subject to any disclaimer, the term of this patent is extended or adjusted under 35 U.S.C. 154(b) by 0 days.

(21) Appl. No.: 14/359,596

(22) PCT Filed: Jun. 7, 2013

(86) PCT No.: PCT/US2013/044786
§ 371 (c)(1),
(2) Date: May 21, 2014

(87) PCT Pub. No.: WO2013/188241
PCT Pub. Date: Dec. 19, 2013

(65) Prior Publication Data
US 2014/0351183 A1 Nov. 27, 2014

Related U.S. Application Data

(60) Provisional application No. 61/657,920, filed on Jun. 11, 2012.

(51) Int. Cl.
*G06F 17/50* (2006.01)
*E21B 44/00* (2006.01)
(Continued)

(52) U.S. Cl.
CPC ............ *G06F 17/5009* (2013.01); *E21B 7/00* (2013.01); *E21B 44/00* (2013.01); *G06N 99/005* (2013.01)

(58) Field of Classification Search
CPC ........ G06N 99/005; G06N 5/025; G06N 7/00; G06K 9/6256; G06K 9/6269
See application file for complete search history.

(56) References Cited

U.S. PATENT DOCUMENTS 6,266,619 B1   7/2001   Thomas et al.
6,810,368 B1 * 10/2004   Pednault ................. G06F 17/18
                                                            706/16
(Continued)

FOREIGN PATENT DOCUMENTS

RU          2421605 C1      6/2011

OTHER PUBLICATIONS

PCT Search Report and Written Opinion application No. PCT/US2013/044786, dated Feb. 27, 2014.
(Continued)

*Primary Examiner* — Luis Sitiriche

(57) ABSTRACT

Building models and predicting operational outcomes of a drilling operation. At least some of the illustrative embodiments are methods including: gathering sensor data regarding offset wells and context data regarding the offset wells, and placing the sensor data and context data into a data store; creating a reduced data set by identifying a correlation between data in the data store and an operational outcome in a drilling operation; creating a model based on the reduced data set; and predicting the operational outcome based on the model.

27 Claims, 9 Drawing Sheets

(51) Int. Cl.
*E21B 7/00* (2006.01)
*G06N 99/00* (2010.01)

(56) References Cited

U.S. PATENT DOCUMENTS

| | | |
|---|---|---|
| 2005/0267719 A1 | 12/2005 | Foucault |
| 2005/0284661 A1 | 12/2005 | Goldman et al. |
| 2006/0173625 A1* | 8/2006 | Moran .................. E21B 44/00 702/9 |
| 2006/0195264 A1 | 8/2006 | El Askary |
| 2007/0179766 A1 | 8/2007 | Cullick et al. |
| 2007/0185696 A1* | 8/2007 | Moran ................ G05B 13/027 703/10 |
| 2007/0284147 A1* | 12/2007 | Moran .................. E21B 44/00 702/9 |
| 2008/0120036 A1 | 5/2008 | Kimminau et al. |
| 2008/0162098 A1* | 7/2008 | Suarez-Rivera ........ E21B 49/00 703/10 |
| 2008/0179094 A1* | 7/2008 | Repin .................... E21B 44/00 703/10 |
| 2008/0208475 A1* | 8/2008 | Karr ..................... G06Q 10/087 702/6 |
| 2009/0157590 A1 | 6/2009 | Mijares et al. |
| 2011/0077868 A1 | 3/2011 | Ozan et al. |
| 2011/0203845 A1 | 8/2011 | Jamison et al. |
| 2012/0118637 A1 | 5/2012 | Wang et al. |
| 2012/0316787 A1* | 12/2012 | Moran .................... E21B 44/00 702/9 |
| 2014/0116776 A1* | 5/2014 | Marx ..................... G06N 7/005 706/11 |

OTHER PUBLICATIONS

European Patent Office, Supplementary European Search Report, dated Jun. 9, 2016, 7 pages, Europe.

Paul F.M. De Groot, Seismic Reservoir Characterisation Using Artificial Neural Networks, May 18, 1999, pp. 71-85, Retrieved from the Internet: URL: http://static.dgbes.com/images/PDF/Seismic_Reservoir_Characterisation_Using_Artifical_Neural_Networks.pdf, retrieved on Jun. 2, 2016.

Federal Service on Intellectual Property, Decision on Grant, dated May 27, 2016, 11 pages, Russia.

Federal Service on Intellectual Property, Decision on Grant, dated May 27, 2016, 9 pages, English Translation, Russia.

* cited by examiner

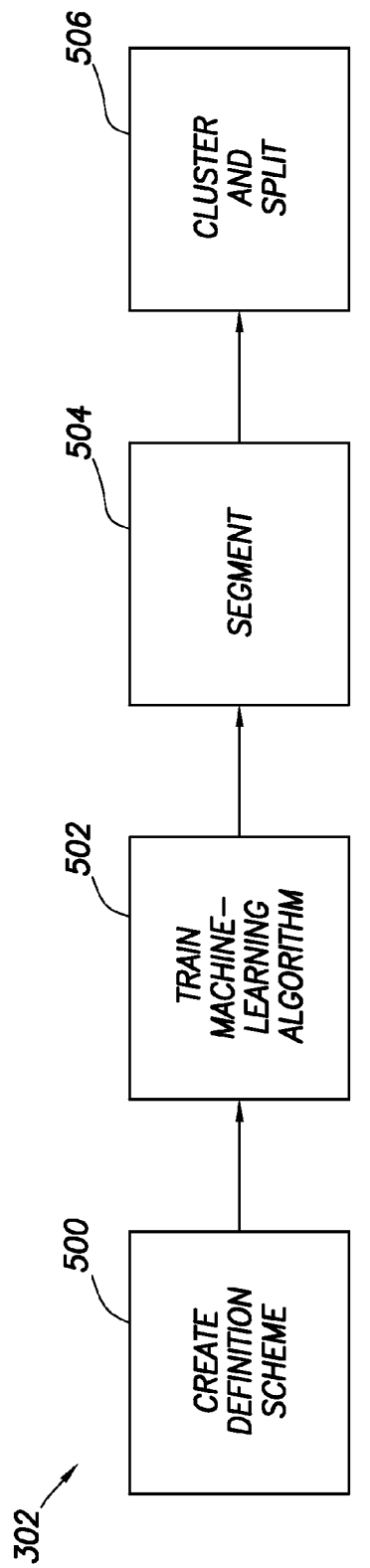
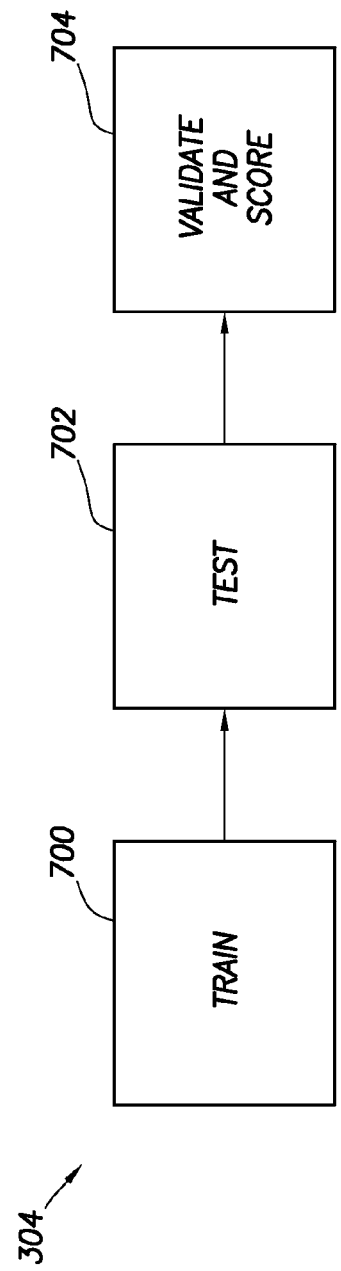
FIG.5
FIG.7

METHODS AND RELATED SYSTEMS OF BUILDING MODELS AND PREDICTING OPERATIONAL OUTCOMES OF A DRILLING OPERATION

BACKGROUND

In the context of drilling a hydrocarbon wellbore, a significant amount of data may be collected contemporaneously with drilling, such as measuring-while-drilling (MWD) data, logging-while-drilling (LWD) data, and data from an array of sensors in and around the drilling rig. The data may be used in the short term to make decisions regarding drilling of the particular wellbore (e.g., adjusting drilling direction, decision to change drill bit). However, data regarding drilling of particular wellbore may not be reviewed again after the wellbore is drilled, and even if such data is reviewed and/or analyzed at a later date, the relationship of the data to operational outcomes of other wellbores drilled earlier in time or later in time is difficult to deduce.

BRIEF DESCRIPTION OF THE DRAWINGS

For a detailed description of exemplary embodiments, reference will now be made to the accompanying drawings in which:

FIG. 5 shows, in block diagram form, an example workflow in accordance with at least some embodiments;

FIG. 7 shows, in block diagram form, example workflow in accordance with at least some embodiments;

NOTATION AND NOMENCLATURE

Figure 1:
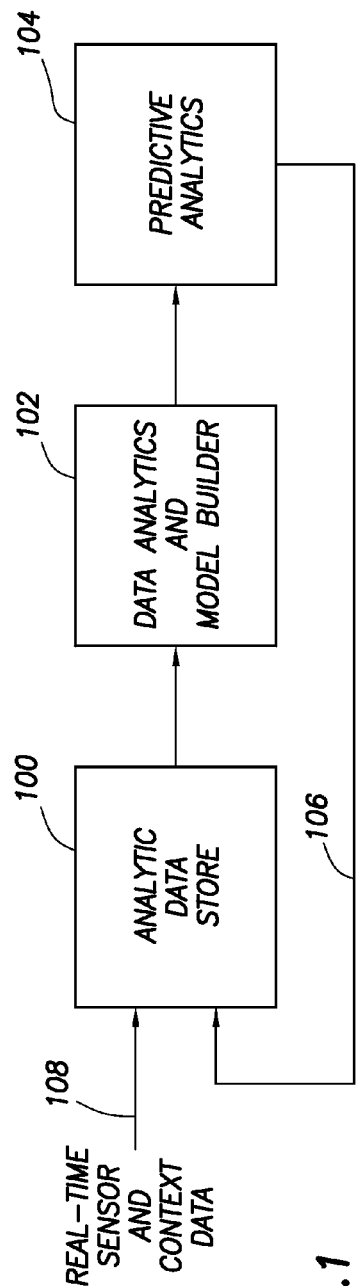
FIG. 1 shows, in block diagram form, a high level flow diagram of the workflow in accordance with at least some embodiments.

Certain terms are used throughout the following description and claims to refer to particular system components. As one skilled in the art will appreciate, different companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ."

Also, the term "couple" or "couples" is intended to mean either an indirect or direct connection. Thus, if a first device couples to a second device, that connection may be through a direct connection or through an indirect connection via other devices and connections.

"Sensor data" shall mean data created by or based on physical sensors associated with a drilling operation, where the data varies based on time or varies based on drilling depth. Examples of sensor data created directly by physical sensors comprise: downhole temperature measured during drilling; bottom hole drilling fluid pressure measured during drilling; logging-while-drilling data; and measuring-while-drilling data. Examples of sensor data created based on (e.g., directly inferred from, or calculating with a deterministic calculation) physical sensors comprise: rate of penetration (ROP) during a drilling operation; and volume of drilling fluid loss as function of time/depth.

"Context data" shall mean data related to aspects of a drilling operation that is not measured by physical sensors associated with a drilling operation. Examples of context data comprise: years of drilling crew experience; type of drill bit used; drilling fluid type; daily cost of lease equipment; physical characteristics of an underground formation.

"Offset well" shall mean a well drilled in the past or being drilled concurrently with a planned or actual wellbore of interest.

"Planned wellbore" shall mean a wellbore, or portions of a wellbore, that has yet to be drilled.

"Real-time" in relation to data shall mean data that was measured or created within the last hour.

"Machine learning algorithm" shall mean a computer program that performs a task that after the computer program is trained to perform the task using a set of training data. Machine learning algorithms may comprise artificial neural networks, support vector machines, decision tree learning algorithms, and Bayesian networks.

"Data cleansing" shall mean removal of data from a data set such that the remaining data in the data set has an improved quality metric.

"Drilling parameter" shall mean a controlled variable of a drilling operation. For example, drilling parameters may comprise: weight on bit; drilling fluid pressure; drilling direction; rotational speed of the drill string; and rotational speed of the drill bit as turned by a downhole motor.

"Operational outcome" shall mean a non-controlled variable or parameter of drilling operation whose actual or predicted value or state changes, in some cases from changes of actual or predicted drilling parameter(s). For example, rate of penetration of drilling through a formation is an operational outcome, drilling fluid loss is an operational outcome, as is prediction of a stuck pipe event.

"Multidimensional data structure" shall mean a logical construct of data plotted or stored in a multidimensional space in a computer-accessible memory. "Multidimensional data structure shall" not be read to require creation of a physical structure.

ORGANIZATIONAL SUMMARY

The specification is organized as a plurality of sections and subsections. The following outline of the sections and subsections is provided to assist the reader in understanding the organizational structure of the document.

OVERVIEW
ANALYTIC DATA STORAGE (DATA GATHERING AND STORAGE)
  Data Types and Historical Shortcomings
  Creation of the data store
    Data integration system
    Data cleansing system
    Data Store
    Real-time aspects
  Analytic data storage
DATA ANALYTICS AND MODEL BUILDING
  Data exploration
    Clustering
    Data classification by descriptive statistics
    Data classification by invariant data
    Data classification by variant data
  Segmentation
    Create definition scheme
    Train machine learning algorithm
  Model building
    Training
    Testing
    Validate and score
PREDICTIVE ANALYTICS
Example operational environment
Operational techniques
IMPLEMENTATION CONSIDERATIONS

DETAILED DESCRIPTION

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

Overview

The various embodiments are directed to methods and related systems of predicting, either in advance of drilling or contemporaneously with drilling, operational outcomes of a drilling operation. More particularly, the example methods and systems are directed to gathering and analysis of large quantities of disparate data generated with respect to offset wells (e.g., sensor data, context data), identifying correlations in the data pertaining to operational outcomes in a drilling operation, creating one or more models based on the correlations, and predicting operational outcomes (including future events) related to the drilling operation based on the one or more parameters.

FIG. 1 shows, in block diagram form, a logical high level overview of workflows in accordance with various embodiments. Each of the example workflows of FIG. 1 represents computer-implemented methods resulting in creation of data structures and/or software tools that are then used in the next workflow. In particular, a first aspect comprises an analytic data store 100 workflow. The analytic data store 100 workflow gathers sensor data and context data from offset wells, and places the data in a data store such that the data (whether sensor or context) may be access by a uniform application programming interface. The second aspect comprises a data analytics and model building 102 workflow. The example workflow 102 analyzes data drawn from the data store of the analytic data store 100 workflow to identity correlations among the data predictive of operational outcomes in a drilling operation. Once the correlations are determined, a reduced data set is created in workflow 102 containing data for which the correlations were determined, and from the reduced data set one or more predictive models are created. The predictive models created in the workflow 102 are then applied in the predictive analytics 104 workflow to predict one or more operational outcomes (e.g., future values of an operational outcome, future events).

In some cases the example workflows of FIG. 1 are used as a planning tool. That is, the example workflows are used to plan and predict drilling parameters to achieve predicted operational outcomes regarding a wellbore that has yet to be drilled. However, in other example systems the workflows of FIG. 1 are used iteratively during drilling of a wellbore. Thus, in example systems the predicted operational outcomes are used in a closed loop sense (as illustrated by line 106), along with real-time sensor data and context data (as illustrated by line 108) to improve and refine the models (and as discussed below in some cases to select among candidate models) during the drilling of a wellbore. Each workflow will be discussed in turn, starting with the analytic data storage 100 workflow.

Analytic Data Storage (Data Gathering and Storage)

Data Types and Historical Shortcomings

There are several types of data associated with a wellbore drilling operation. In particular, a drilling rig may be associated with an array of sensors measuring drilling parameters, such as drilling fluid pressure at the surface, flow rate of drilling fluid, and rotational speed of the drill string. The example sensors noted create a stream of data that is in most cases indexed against time (e.g., pressure as function time, revolutions per minute (RPM) as a function of time). Moreover, the bottomhole assembly of the drill string may comprise MWD and/or LWD tools that measure downhole drilling parameters during drilling. Example downhole drilling parameters may comprise downhole drilling pressure, weight-on-bit, downhole temperature, inclination of the bottomhole assembly, rotational speed of a rotor of a downhole mud motor, and formation parameters measured by LWD tools (e.g., resistivity, porosity). The downhole drilling parameters may be indexed against time or a time-like parameter (e.g., depth which can be traced back to time when needed by correlating to the moment when the downhole sensor passed by said depth). The various data types discussed in this paragraph will be referred to as sensor data. In most cases, sensor data is high volume, high frequency data—implying that the data stream is near continuous during times when the data is being created, and involves a significant amount of information.

Another type of data of interest to the current specification is data associated with context of the drilling operation. Examples of context may comprise identity of the drilling operator (i.e., company name), identity of a drilling crew, cumulative years of experience of a drilling crew, number of members of a drilling crew, the type of drilling fluid used, the type of drill bit used or being used, the daily cost of leased equipment (e.g., daily cost of the drilling rig), and mineralogy of distinct underground formation. The various data discussed in this paragraph will be referred to as context data. It is noted that while the examples of context data may include data with time dependence (e.g., cumulative years of experience of a drilling crew), the rate at which the context data changes as a function of time (e.g., days, months, years) is significantly slower than the sensor data (e.g., a pressure reading taken and recorded 100 times every second).

The example data types are traditionally stored in different and distinct data structures. For example, MWD and LWD data may be stored in extensible markup language (XML) documents, and more specifically as well site information transfer standard markup language (WITSML) documents organized and/or indexed against time/depth. By contrast, context data may be stored in non-time-indexed manner, such as in a relational database (e.g., Engineering Data Model (EDM™) relational database). In other cases, historical data (regardless of the data type) regarding a wellbore may be stored in a binary large object (BLOB) storage format which cannot be easily queried to extract pertinent information.

In the related art, analyzing historical data spanning the different data types is difficult, if for no other reason than the disparate data storage techniques make gathering the data difficult and/or significantly time consuming. For this reason, while various oil and gas companies may have and store significant volumes of historical sensor data and context data, once a wellbore is completed the data is not thereafter used either in predicting operational outcomes of planned future wellbores to be drilled, or during drilling of wellbores whose drilling starts after completion of the offset wells.

Creation of the Data Store

Figure 2:
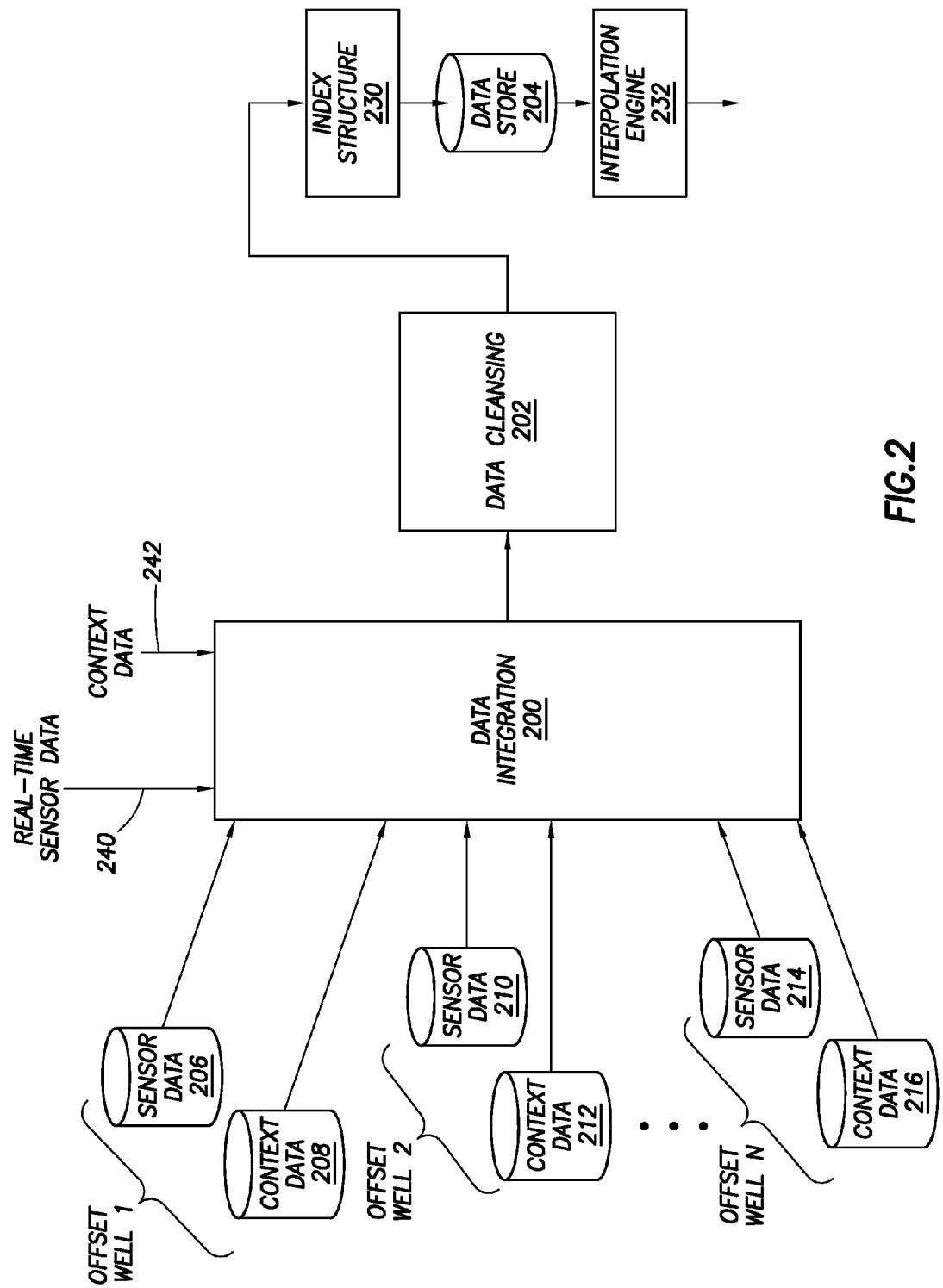
FIG. 2 shows a visual depiction of an example workflow in accordance with at least some embodiments.

FIG. 2 shows a visual depiction of a relationship among various data types and combining into a data store. In particular, FIG. 2 shows sensor data and context data associated with offset wells. The various data types associated with the offset wells are supplied to a data integration system 200, which as the name implies merges the historical data (both sensor and context) from the various offset wells. The data integration system 200 is discussed more below. The data collected may be supplied to a data cleansing system 202, which performs various alignments, smoothing, and interpolation functions (also discussed more below). The product of the example system of FIG. 2 is a data store 204 within which the various data types from various offset wells are stored, and from which the data is accessible for downstream workflows (such as data analytics and model building, and predictive analytics). Gathering the various data types into the "single" data store enables not only the ability to query across the entire data set held in the data store, but also shortens the time frame for access to enable decision making based on the data in the data store in time frames on the scale of minutes or hours (rather than weeks or months). The specification first turns to a more detailed description of the data integration system 200.

Data Integration System

Still referring to FIG. 2, the data integration system 200 is logically coupled, at least initially, to sensor data and context data from a plurality of offset wells. As illustrated, the data integration system 200 couples to the sensor data 206 and context data 208 for "offset well 1", couples to the sensor data 210 and context data 212 for "offset well 2", and couples to the sensor data 214 and context data 216 for "offset well N". FIG. 2 thus illustrates that the data is integrated across a plurality of offset wells, and not limited to just three offset wells. In some cases, the offset wells are in close proximity to a planned or actual wellbore of interest. For example, the offset wells may be all the wells in the field that have been drilled through and/or into the same underground hydrocarbon bearing formation. In other cases, the offset wells may be wells in an entire region, yet spanning multiple target formations. Further still, the offset wells may be all the wellbores previously drilled by a particular operator, in some cases anywhere in the world.

In most cases the sensor data 206, 210, and 214 of each offset well is either time indexed, or indexed against depth which is a time-like parameter. However, the offset wells are likely drilled on different calendar days (i.e., at different times). Likewise, even though offset wells may be drilled through and/or into the same underground hydrocarbon bearing formations, the surface elevation of each wellbore may be different, and further the absolute depth of the hydrocarbon bearing formation may different for each offset well owing to hydrocarbon bearing formations residing in other than completely horizontal orientations. Thus, in order to more easily analyze data across the offset wells, the data integration system 200 may perform various alignment procedures, such as alignment of time bases (e.g., start time of drilling operations) and alignment or compensation for elevation differences of the surface and/or underground formation (e.g., alignment to a reference datum elevation).

In some example systems, the data density of the sensor data may be greater than needed to predict one or more operational outcomes. For example, some sensor data may include hundreds of samples per second, yet data density of hundreds of samples per second may not be needed to predict operational outcomes such as ROP, drilling crew efficiency, or drilling fluid loss. Thus, in some example systems the data integration system 200 may perform a data down-sampling function whereby the number of data samples is reduced. In the example case of a set of sensor data having hundreds of samples per second, the data integration system 200 may reduce the sample rate to one sample per second. Any suitable method may be used to down-sample the data, such as an average value selection, mean value selection, or random selection. It is noted that down-sampling is not necessarily performed in every situation, as the operational outcome to be predicted may need the higher sample rates for accuracy.

On the other hand, in some cases the sensor data may be non-contiguous across the sample period or depth. For example, dogleg severity of a wellbore may be defined with respect to specific survey points (i.e., depths) in the wellbore, but not all depths. The data integration system 200 may thus expand certain localized data to other depths using any suitable mechanism, such as straight line interpolation or various curve fitting algorithms.

Beyond the sensor data and alignment issues, the data integration system 200 also folds in the context data 208, 212, and 216 from the offset wells. In some cases, the context data has no actual time dependence (e.g., mineralogy), but can be attributed a time dependence with the "time period" spanned by the sensor data. In the example of mineralogy, the time dependence can be attributed to periods of time when the offset well was being drilled through the formation with the ascribed mineralogy. Other context data has a time dependence (e.g., drill bit used), but such time dependence is slowly varying in comparison to sensor data. Here again, the data integration system 200 may attribute a time dependence as needed. In the example of drill bit used, the time dependence can be attributed to periods of time (and/or depths) when the particular drill bit was being used. Yet still other context data may have no time dependence, or a time dependence that is so slowly varying that the time dependence can be considered a constant over the time span of collection of sensor data (e.g., number of years of experience of the drilling crew). Here again, the data integration system 200 may attribute a time/depth dependence as needed to "align". In the example of number of years of experience of the drilling crew, the time dependence may set at a constant by the data integration system 200 across the time span of collection of the sensor data.

Data Cleansing System

In some example systems, the data provided to the data store is cleansed prior to being used for the further workflows noted in FIG. 1. In FIG. 2, the data cleansing system 202 is shown to logically reside between the data integration system 200 and the actual data store 204. It follows that in some cases the data cleansing aspects are performed prior to insertion of the data into the data store. However, in other embodiments the data may be placed in the data store 204, and thereafter analyzed and cleansed as desired.

In some example systems, the data cleansing system 202 performs multiple types of data analysis as part of the cleansing, including data removal when needed and adjusting values when needed. Example techniques used by the data cleansing system may comprise: invalid data identification and removal; deterministic techniques to identify data anomalies; and probabilistic techniques to identify data anomalies. Each will be discussed in turn.

One cleansing technique is the removal of invalid data. Examples of invalid data which may be removed comprise text strings in value fields, values in text string fields, null fields where values were expected, placeholder entries like "TBD" and "NA", and the like. Stated otherwise, the example "invalid data" aspect of data cleansing may test for the presence of invalid data taking into account the expected data type under analysis, and any such invalid data identified may be removed.

In addition to, or in place of, the data removal aspects of data cleansing discussed immediately above, the example data cleansing system 202 may apply deterministic techniques to identify data anomalies not identified in the invalid data analysis. For example, even in a group of values of sensor data where each datum member of the group is not invalid, portions of the data may nevertheless represent "bad" data. Consider, as an example, a simplified group of gas saturation values for a continuous formation as a function of depth of {90%, 91%, 90%, 20%, 90%, 89%}. Each of the values in the example group may fall within the expected range of gas saturation values for the formation; however, it is unlikely that gas saturation of a formation across contiguous depths would drop precipitously to 20% when at abutting depths the gas saturation is measured as 90%.

Thus, in accordance with at least some example systems, the data is cleansed by way of deterministic statistical techniques (e.g., standard deviation analysis, chi-squared distribution analysis). For the example group of values above, an analysis of the standard deviation of the group against each individual element would reveal the 20% value to be multiple standard deviations below mean or average (even considering the 20% value in calculating the standard deviation value). For each datum found to be suspect under the statistical calculations, the data cleansing system may remove the datum and/or replace the datum.

Moreover, the data cleansing system 202 may apply deterministic filters to the data to identify out of range values for any particular context. Consider, as an example, a datum indexed against depth of 90,000 feet in a well where total hole length is 2000 feet. In this example situation the example datum is outside the logical bound of the total hole length, and thus the example datum may be removed. As another example, consider out of range values such as a negative weight-on-bit (WOB) or negative ROP during drilling. Again, these out of constraint values may be removed. Stated otherwise, the data cleansing system 202 may apply the data to deterministic (i.e., questions with yes/no answer) tests (e.g., minimum/maximum value test, boundary value tests according to specifications) as part of the data cleansing techniques.

Further in addition to, or in place of, the deterministic tests, the example data cleansing system 202 may apply probabilistic techniques (e.g., data mining techniques the data may be analyzed for pattern-based anomalies) to identify data anomalies not identified in the deterministic analysis. For example, torque, revolutions per minute and top drive motor amperage are three drilling parameters that have very high correlations. If two parameters follow the same trends (trends that might be complex, involving a mixture of general semi-linear increase, sinusoidal oscillations and semi-random spikes), and the third parameter temporally does not, the times when the latter is not matching might be discarded. It must be appreciated that data mining techniques and cleansing algorithms, just as down-sampling, must always be performed in the context of desired outcome. For example, in the previous instance, if the outcome was to use a clean signal that models the downhole rotation, such cleansing might be appropriate. On the other hand, such a lack of correlation is generally indicative of faulty sensors, and therefore such cleansing might not be performed if the desired outcome was to predict sensor failure. In some cases, the probabilistic analysis may be performed by a machine learning algorithm (e.g., a support vector machine (SVM)). In particular, patterns indicative of data anomalies may be predetermined, or may be determined based on analysis of a subset of the overall data. Regardless, the data (or the balance of the data) may be analyzed using the SVM to identify (or further identify) patterns indicative of anomalies. In some example systems, the data identified using the probabilistic techniques are removed. In other cases, the data identified using the probabilistic techniques are corrected. In yet still other cases, the data identified using the probabilistic techniques are left unchanged, but a value indicative of data quality may be appropriately adjusted based on the anomalies identified.

Data Store

Still referring to FIG. 2, the data store 204 may take any suitable form. With respect to the sensor data, in accordance with various embodiments the data store implements a storage scheme that enables sufficiently fast access to the sensor data to be used for other follow-on aspects, discussed more below. In particular, sensor data may be stored in a columnar format (e.g., HBase on a Hadoop Distributed File System) indexed against time. However, a time index alone may be insufficient to enable suitable access times given the large volume of data, and thus the example embodiments also comprise an index structure 230 "on top of" the columnar data of the data store 204, such that initial indexing may be within the index structure 230 as a coarse location finder, and then fine indexing within the columnar format data. Thus, by way of an insert application programming interface (API), time-series indexed data may be quickly inserted in the time series database, and by way of an extraction API information may be read and used for other aspects, discussed in greater detail below.

In some cases, data missing from the various offset wells is created by any suitable technique by the data integration system 200. However, in other cases missing data is addressed in other ways. For example, in FIG. 2 the data store 204 is associated with a "back-end" interpolation engine 232. In particular, in addition to, or in place of, the data integration system 200 performing interpolation to replace missing data, the interpolation engine 232 may provide an interpolation function for any requested data which is otherwise missing in the data store 204. In the case of historical offset well data, the amount of time needed to perform the interpolation function for missing data may not be of consequence. That is, for purposes of predicting operational outcomes for a wellbore that has yet to be drilled, the amount of time needed to interpolate data as part of the data integration system 200 may not be of consequence. However, for predicting operational outcomes in real-time with drilling and creation of real-time sensor data, the system may forego interpolating for missing data unless and until the data is requested from the data structure, in which case the interpolation engine 232 may perform the task in real-time with the request.

While FIG. 2 shows the data store 204 as a single "entity", it will be understood that the data store 204 may span a plurality of disk drives, a plurality of disk drive arrays, and/or a plurality of computer systems. In some cases, the data store may be implemented on "the cloud", and thus the number of computer systems, and their respective locations, may not be known and/or may change with loading. In the example systems, a single, unified API is used to place data in the data store, and read data from the data store, and the API is not necessarily constrained to operation with a single physical location for the data store 204.

Real-Time Aspects

Still referring to FIG. 2, the various embodiments discussed to this point have mostly been in reference to gathering sensor data regarding offset wells and context data regarding offset wells, and placing the data into a data store to be used for further analysis. However, in other cases portions of the sensor data may be real-time sensor data, and context data associated with the real-time sensor data. Thus, the same techniques used with respect to the offset wells of gathering the disparate data types and inserting the data into the data store (including the data cleansing aspects) may be implemented in the example system in real-time with drilling a wellbore of interest. In particular, FIG. 2 shows real-time sensor data and associated context data for a wellbore of interested are applied to the data integration system 200 by way of arrows 240 and 242, respectively. In most cases, the data integration performed with respect to the offset wells will have been completed by the time the real-time sensor data is being applied such that only the real-time sensor data and related context data are of concern to the data integration system 200. However, in the case of wells being simultaneously drilled, the offset well data may likewise be "real-time" data. Stated otherwise, an operable system may comprise the offset well data being created in "real-time" as well, but for ease of description the balance of the specification will assume that the offset well data is all historical data.

Analytic Data Storage

The end result of the analytic data store 100 workflow is a data store with data from a plurality offset wells, and in the case of real-time operations the data store may be continually growing in size, starting initially the offset well data, and growing with insertion of the real-time sensor data and related context data. Conceptually, the data store creates one or more multidimensional data structures, with time/depth being one "dimension", but any of the relevant context data may be "dimensions" in the multidimensional data structure as well. In some cases, each offset well has a distinct multidimensional data structure, but in other cases offset wells may be combined to create multidimensional data structures that logically span many offset wells.

The index structure 230 the sits "on top of" the data store decreases access time for insertion such that the data in the data store is reasonably available for real-time predictions for a wellbore of interest being drilled. The specification now turns to the data analytics and model building 102 workflow.

Data Analytics and Model Building

Figure 3:
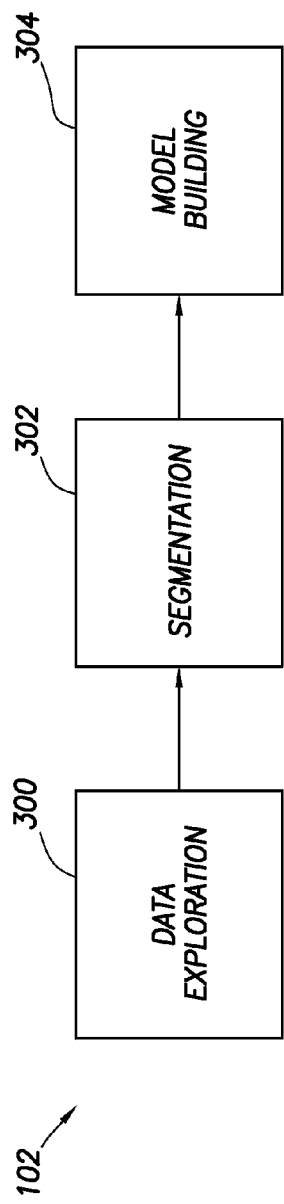
FIG. 3 shows, in block diagram form, an example workflow in accordance with at least some embodiments.

FIG. 3 shows, in block diagram form, an example workflow that may be performed as part of the data analytics and model building 102 workflow. In particular, FIG. 3 shows a data exploration 300 workflow, with the results of the data exploration 300 workflow applied to a segmentation 302 workflow, and finally the results of the segmentation 302 workflow are applied to a model building 304 workflow. Each workflow will be discussed in turn.

Data Exploration

The data store 204 discussed above contains one or more multidimensional data structures. Within the data structures various correlations exist among the sensor data, the context data, and an operational outcome in a drilling operation to be predicted (e.g., ROP, fluid loss). In many cases the correlation between sensor data and context data on the one hand, and on the other hand the operational outcome to be modeled and predicted, will be known in advance. For example, it is likely known in advance that ROP is strongly correlated to the formation type being drilled. However, in accordance with example embodiments at least one correlation between portions of the sensor data and portions of the context data in the multidimensional data structure is identified, where the correlation is predictive of the operational outcome, and where the correlation not selected in advance of the identifying.

Figure 4:
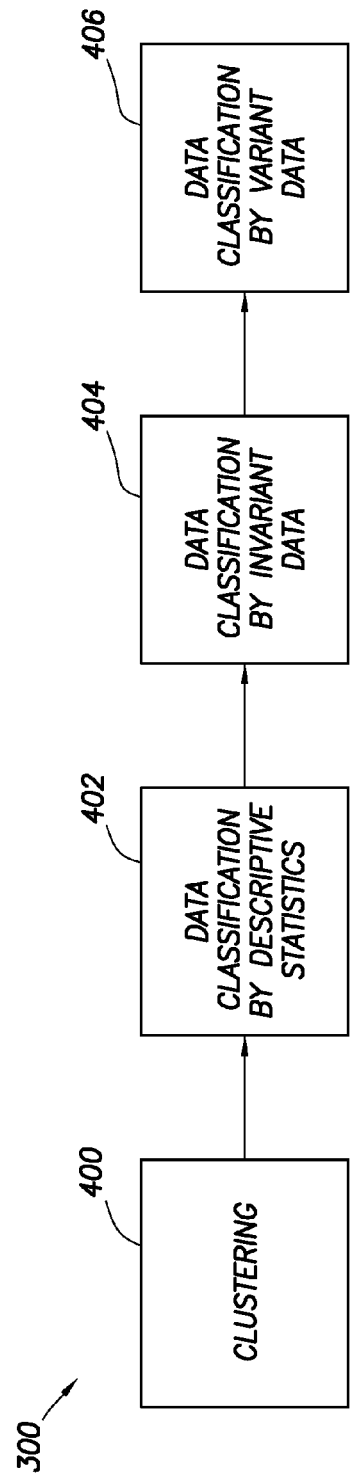
FIG. 4 shows, in block diagram form, an example workflow in accordance with at least some embodiments.

FIG. 4 shows, in block diagram form, a high level overview of example workflows being a part of the data exploration 300 workflow. In particular, the data exploration 300 workflow may comprise a clustering 400 workflow, a data classification by descriptive statistics 402 workflow, a data classification by invariant data 404 workflow, and a data classification by variant data 406 workflow. Each will be discussed in turn.

Clustering

The data store contains a multidimensional data structure that relates "facts" (e.g., sensor data) to "dimensions" (e.g., time, context data). Any number of dimensions is possible, and in some cases the multidimensional data structure may be thought of as implemented a star schema. In the clustering 400 workflow, clustering is performed on the multidimensional data structure(s). Stated otherwise, the "facts" (e.g., selected sensor data) and the "dimensions" (e.g., selected context data) are applied to clustering algorithm. However, unlike related-art clustering where the "distance" measure that defines a cluster among the clustered data points is preselected (e.g., preselected Euclidean distance for wellbore locations), in accordance with example embodiments the clustering algorithm portion is performed without limiting the clustering to any particular distance measure. In other words, the data are applied to one more clustering algorithms, and the data itself is reveals what the most relevant "distance" function (i.e., correlation) happens to be for the data.

Consider possible "distance" measures that may be associated with ROP as the operational outcome of interest, the "dimensions" in the form of context data associated with crews that work on a drilling rig. For example, for one set of data cumulative number of years of experience for a crew may provide a better correlation to ROP than other possible "distance" measures (e.g., average age, days at sea, number of members on the crew). For another set of data, the correlations may be stronger in some other dimension, like number of crew members. The point of the examples is to highlight that, in accordance with at least some embodiments, the clustering is performed without preconceived notions of what the "distance" measures should be. In the first example, cumulative number of years of experience turned out to be the best "distance" measure (that is, showed better correlation), and in the second example the number of members of the crew turned out to be the best "distance" measure (showed better correlation).

As yet another example outside the crew context, consider wellbore strata (e.g., identity of the layer of an underground formation) as it relates to ROP. Wellbore strata may be defined in terms of distance below surface (true vertical depth), but in many cases a layer of interest is non-horizontally disposed relative to the surface, and thus when the clustering is performed true vertical depth may show low correlation, but contextual data in the form of layer type may show a high correlation. Thus the "distance" measure in this example may be layer type (or layer transitions).

While there will be better and worse "distance" measures in the clustered data, the next step in the illustrative method may be to select the best "distance" measures. In some cases, the selection may involve displaying the clusters in a fashion whereby either computer intelligence and/or the human intelligence may be applied to select the best "distance" measure. For example, a topographical view may be created where each cluster is displayed in such a way that the human eye can discern the clusters (e.g., color variation, heat maps, shading). In other cases, a computer program may display the clusters in "layers" based on the clustering results, or perhaps in three-dimensional projection.

Once one or more correlations related to the operational outcomes of interest are determined, the next steps in the illustrative process of the data exploration 300 workflow are the series of data classification workflows (i.e., workflows 402, 404, and 406). A high level overview of the further workflows (as a group) is that the workflows are a method to create parameters, based on clustering, which parameters are later used to create a reduced data. That is, the analysis may commence with a terabyte of data or more, and the further workflows of FIG. 4 may be used to identify (but not yet create) a smaller subset of the data that is representative of the correlations found.

Data Classification by Descriptive Statistics

A first example data classification workflow is the data classification by descriptive statistics 402 workflow. That is, a series of descriptive statistics are developed about the relevant data identified by the clustering. Consider, as an example, that if analysis reveals that 90% of the relevant data falls in a narrow band of values, a representative sample of the data may be taken (in later workflows) from the narrow band of values. As yet another example, consider that if in the analysis a number of peaks in the data are identified, a representative sample of the data may be taken (in later workflows) based on the location of the peaks. In yet another example, consider that in the analysis the "distance" between average values in each histogram is identified, a representative sample of the data may be taken (in later workflows) based on the distance between the average values. In a final example, consider that if the analysis shows a certain skew within the data (e.g., an uneven distribution across binned data), a representative sample of the data may be taken (in later workflows) taking into account the skew.

The descriptive statistics mentioned in the immediately preceding paragraph are merely examples. In any particular situation, none, some, or all the descriptive statistics may be used as a precursor to the segmentation 302 workflow discussed more below.

Data Classification by Invariant Data

The second example data classification workflow is the data classification by invariant data 404 workflow. That is, the analysis is with respect to the data and one more dimensions of interests, such as classification based on time bins of varying sizes, depth relationships, or any other dimension or group of dimensions identified in the clustering. Again, data is not necessarily extracted at this stage, but the various processes used to understand the data for later extraction and application to the various models Data Classification by Variant Data The third example data classification workflow is the data classification by variant data 406 workflow. Conceptually, this workflow may identify patterns that do not match general trends, and keep the patterns identified as new indications. That is, the data classification may be based probabilistic techniques to identify data anomalies. The analysis of this logical section may be characterized as pattern matching the data to identify patterns. As yet another example, various embodiments may involve classification based on natural language processing of the data from free floating text (e.g., time summary, 24 hour summary). As yet another example, various embodiments may involve classification of the data based on anomalies detected by pattern matching.

Summarizing before continuing, the data exploration 300 workflow, shown in detail in FIG. 4, identifies correlations in the data to the operational outcome of interest. A data set identified by the based on the correlations is then classified through one or more data classifications techniques as a precursor to the segmentation, discussed immediately below.

Segmentation

Referring briefly to FIG. 3, the next step in the illustrative workflow is the segmentation 302 workflow (as part of the larger Data analytics and model builder 102 workflow of FIG. 1). FIG. 5 shows, in block diagram form, a set of workflows that may be implemented as part of the larger segmentation 302 workflow. In particular, segmentation may involve creation of a definition scheme 500 workflow, training a machine-learning algorithm 502 workflow, a machine-learning algorithm-based segmentation 504 workflow, and finally a cluster and split 506 workflow. Each will be discussed in turn.

Create Definition Scheme

The first example workflow is creation of a definition scheme 500. In particular, the definition scheme defines, at the conceptual level, the data from the overall data store that has been identified as correlated to the operational outcome of the drilling operation to be predicted. In example systems, the definition scheme is created based on the data classifications associated with the data exploration 300 workflows, and more particularly the data classifications workflows (i.e., 402, 404, and 406) performed after the clustering 400 workflow.

From the classification by descriptive statistics, the classification by invariant data, and/or the classification by variant data, a set of definitions is created that "defines" which data in the large quantity of data in the data store is relevant to the operational outcome of the drilling operation to be predicted.

Train Machine Learning Algorithm

Figure 6:
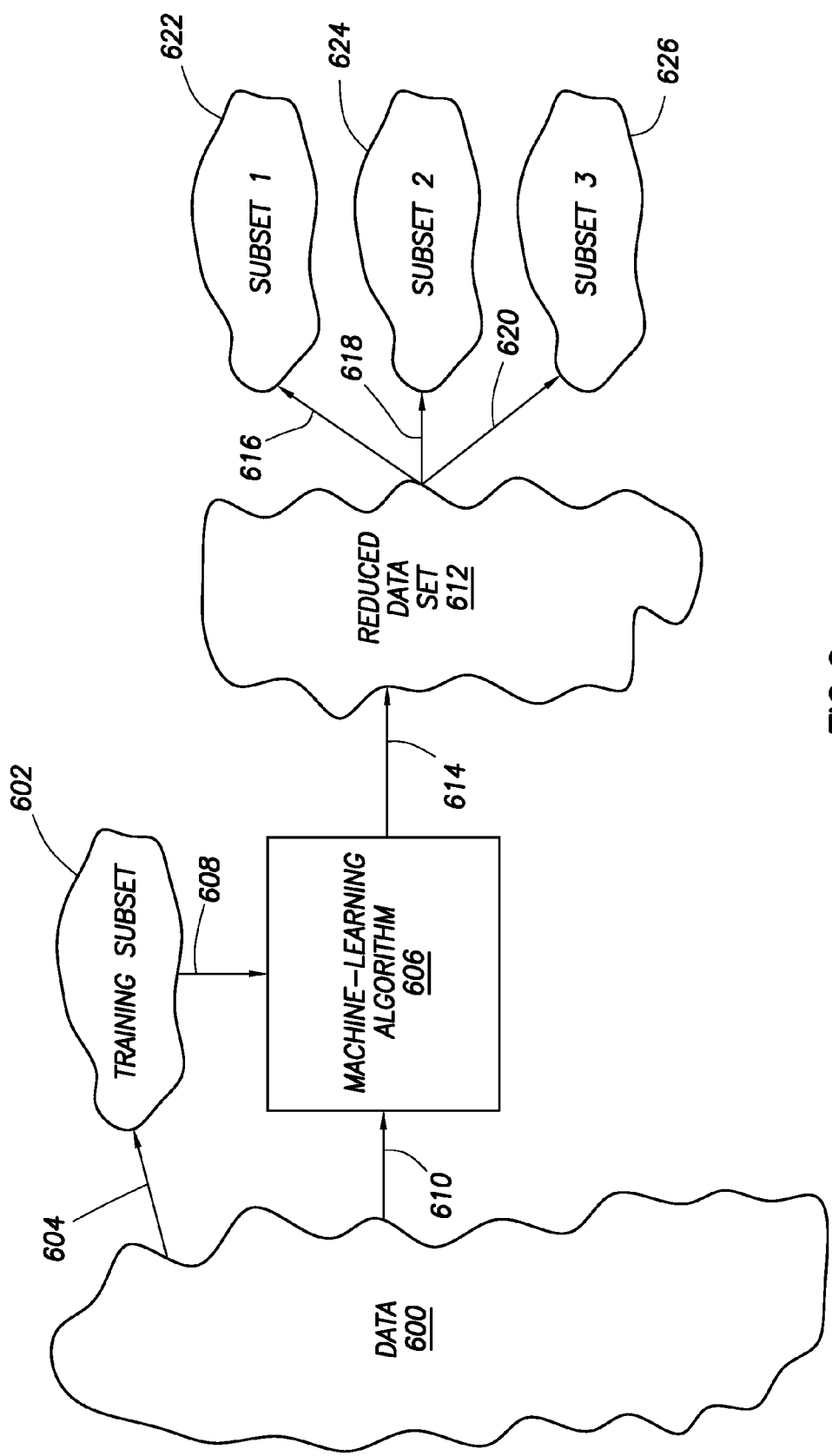
FIG. 6 shows an example workflow in accordance with at least some embodiments.

In accordance with example systems, the segmentation of the overall data set stored in the data store 204 to arrive at a reduced data set is performed, at least in part, by a machine-learning algorithm. In the case of segmentation to produce the reduced data set, neural networks and/or state vector machines may be particularly suited to perform the segmentation, but other machine learning algorithms may be used in addition or in place of the neural networks and/or state vector machines. FIG. 6 shows a conceptual view of the workflows performed in relation to the segmentation 302 workflow, and the following paragraphs simultaneously reference FIGS. 5 and 6.

Regardless of the type of machine-learning algorithm to be used, the machine learning algorithm needs to be trained. Thus, using the definition scheme created in workflow 500, the data in the data store is analyzed and a training subset is extracted. That is, data in the overall data 600 is analyzed under the definition scheme, and a small training subset 602 of the data is created, as shown by arrow 604. Using the training subset 602, a machine learning algorithm 606 is trained, as shown by arrow 608. That is, the machine learning algorithm is provide the smaller training subset 602 of data, and is trained therewith.

Once the machine learning algorithm is trained, the illustrative workflow progresses to the actual segmentation 504 workflow. That is, data 600 in the overall data set is applied to and/or otherwise made available to the trained machine learning algorithm 606, as illustrated by arrow 610. The machine learning algorithm 606 extracts the relevant data from the overall data 600, and thereby creates the reduced data set 612, the extraction illustrated by arrow 614. As will be discussed further below, the reduced data set is used to create and train various models that are then used to predict operational outcomes of the drilling operation.

Still referring simultaneously to FIGS. 5 and 6, the next step in the illustrative set of workflows is the cluster and split 506 workflow. In particular, from the reduced data set 612, three representative subsets of data are created, as illustrated by arrows 616, 618, and 620 and respective subsets 622, 624, 626. Splitting the reduced data set into the three subsets 622, 624, and 626 may be comprise initially applying the reduced data set to one or more clustering algorithms. The clustering performed with respect to the reduced data set is different than previous clustering in that the previous clustering was to help identify attributes or dimensions of interest in the overall data population. Clustering within the reduced data set, by contrast, is a precursor to creation of the smaller data subsets 622, 624, and 626, which data subsets will be used in training, testing, and validating models (discussed more thoroughly below). In some cases, the distance metrics for the clustering may be determined by the data itself, but in other cases the distance functions are provided externally. In yet still other cases, a combination of algorithmically selected distance functions and manually specified distance functions may be used.

Clustering of the data in the reduced data set will reveal two or more centroids ("center" of the data points associated as a cluster). In order to select data for creation of the data subsets, a plurality of gradations based on the distance function are defined from each centroid. The gradations thus define regions of "proximity" to each centroid. In accordance with at least some embodiments, the selection of data subsets may thus involve sampling data points within each gradation associated with a centroid. For example, to create the first data subset 622, a computer system may programmatically select a predetermined percentage (e.g., 33%) of data points in the "closest" gradation, a predetermined percentage (e.g., 33%) of the data points in the second gradation, and so on. The inventors of the present disclosure have found the sample sets are more uniform using the above-noted selection method than using other sampling methods, such as random samples within the cluster.

Before continuing is it noted that, in other embodiments, multiple reduced data sets may be created. That is, the data exploration 300 workflow may be used to identify relevant data for a plurality of operational outcomes in the drilling operation. In some cases, each operational outcome to be predicted may have a distinct reduced data set created. In other cases, there may be a single operational outcome to be predicted, but in order to have multiple models (that may be used over distinct time frames and/or distinct depth ranges), multiple reduced data sets may be created. It is further noted that a reduced data set is not necessary tied to only a single model to be created—a reduced data set created (and more particularly, the subsets created) may be used to train and test distinct models.

Model Building

FIG. 7 shows, in block diagram form, various example steps in performing the model building 304 workflow. The models created (hereafter candidate models) may take many forms. For example, a candidate models may comprise: neural networks (including multiple neural networks with varying numbers of nodes); support vector machines; mathematical models; rules-based models; and statistical models. With respect to one more candidate models to be created, the example workflow involves a training 700 workflow, a testing 702 workflow, and a validation and scoring workflow 704. Each will be discussed in turn.

Training

With the overall goal of producing one more candidate models to be used to predict an operational outcome of a drilling operation, a first step may be creating the candidate model(s) based on data subset 622 (hereafter the training subset). In the case of mathematical and statistical models, the models may be created using the training subset. In other cases, the underlying form of model may already be known, such as a neural network or state vector machine. Thus, rather than "creating" the candidate model per se, the training subset may be used applied to the candidate model to train the candidate model. Regardless of the precise form, one or more "trained" candidate models are created using the training subset.

The candidate models, even trained candidate models, are not necessarily always "good" models. In fact, multiple candidate models of the same underlying type (e.g., neural networks with varying numbers input, output, and/or "hidden" nodes) may differently predict the very same operational outcome when trained on the same training subset. Thus, in accordance with various example embodiments, the next illustrative workflow is testing 702 the one more candidate models.

Testing

Using data subset 624 (hereafter the testing subset), each candidate model created and trained using the training subset is tested using the testing subset. While the data in the testing subset is "different" than the training subset, the sampling techniques used to create the training subset and the testing subset should ensure that relationships of the operational outcome in the drilling operation and data in each subset about the same. Thus, the one more candidate models are "run" using the using the testing subset, and the predictive results gathered.

Validate and Score

In cases where multiple candidate models are created and testing using the same respective training and testing subsets, the predictions of the candidate models may be compared and contrasted to each other, and from the analysis confidence levels of each candidate model (at least among the candidate models) may be deduced. However, in accordance with yet still further embodiments, the predictive outputs of the candidate models (i.e., the predicted operational outcomes) may also be tested against the third subset 626 (hereafter the validation subset). Various error metrics are generated for each candidate model based on the validation subset, such as root mean square error (RMSE), mean absolute percentage error (MAPE), and other custom metrics.

Moreover, the error metrics for each candidate model may take into account data quality of the underlying data used to create and test the model. For example, consider a situation where multiple segmentation workflows take place based on varying definition schemes. The multiple segmentation workflows may result in different (though conceptually overlapping) reduced data sets, and distinct sets of candidate models may be created based each reduced data set. However, a quality metric of the data in each reduced data set may not be the same. The quality metric may be lower for reduced data sets where significant data is missing and higher for reduced data sets where more of the relevant data is present. Moreover, statistical analysis of each reduced data set may reveal higher or lower confidence intervals for the data in the reduced data set.

Thus, the error metrics created for each candidate model may include contributions not only from analysis against the validation subset, but also contributions based on the quality metrics of the reduced data set from which a candidate model was built and tested.

Consider, as an example, a plurality of candidate models created based on a reduced data set created for the purpose of predicting ROP. That is, the sensor data and context data from a plurality of offset wells, including the actual ROP experienced in the plurality of offset wells, may be analyzed and correlations determined. Segmentation may thus create the reduced data set, and the reduced data set may thereafter be split into the training, testing, and validation subsets. One or more candidate models may be trained and tested, and the ROP predictions of the candidate models may be compared against the "actual" ROP of the validation subset. The various error metrics may be determined for the predicted versus actual ROP, and adjusted based on the quality metrics of the reduced data set. In some cases, one or models may be discarded based on the error metrics. In other cases, however, the candidate models may be ranked for future use.

Predictive Analytics

Returning briefly to FIG. 1, the next step in the example methods and systems is the predictive analytics 104 workflow. The predictive analytics can be thought of as having two forms—predicting operational outcomes in advance of the drilling operation (i.e., during the wellbore planning stages) and predicting operational outcomes during the drilling operation. The aspects of predicting operational outcomes in advance of the drilling operation are effectively discussed above. In order to provide context to the predicting of operational outcomes during the drilling operation, reference is made the example drilling system of FIG. 8.

Example Operational Environment

Figure 8:
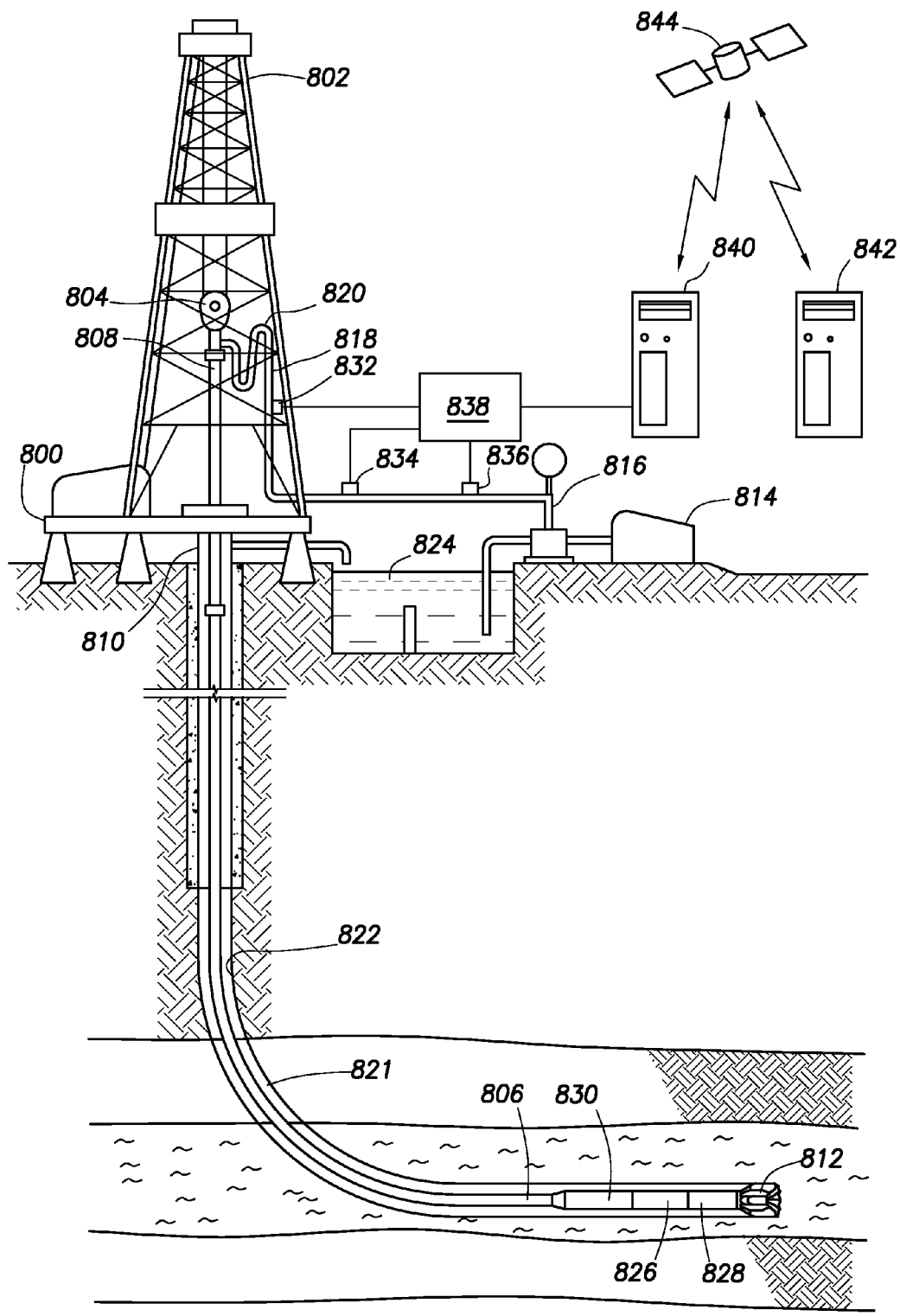
FIG. 8 shows an example drilling operational in accordance with at least some embodiments.

FIG. 8 shows a drilling operation in accordance with at least some embodiments. In particular, FIG. 8 shows a drilling platform 800 equipped with a derrick 802 that supports a hoist 804. Drilling in accordance with some embodiments is carried out by a string of drill pipes connected together by "tool" joints so as to form a drill string 806. The hoist 804 suspends a top drive 808 that is used to rotate the drill string 806 as the hoist lowers the drill string through the wellhead 810. Connected to the lower end of the drill string 806 is a drill bit 812. The drill bit 812 is rotated and drilling accomplished by rotating the drill string 806, by use of a downhole "mud" motor (not shown) near the drill bit 812 that turns the drill bit, or by both methods. Drilling fluid is pumped by mud pump 814 through flow line 816, stand pipe 818, goose neck 820, top drive 808, and down through the drill string 806 at high pressures and volumes to emerge through nozzles or jets in the drill bit 812. The drilling fluid then travels back up the wellbore via the annulus 821 formed between the exterior of the drill string 806 and the wellbore wall 822, through a blowout preventer (not specifically shown), and into a mud pit 824 on the surface. On the surface, the drilling fluid is cleaned and then circulated again by mud pump 814. The drilling fluid is used to cool the drill bit 812, to carry cuttings from the base of the borehole to the surface, and to balance the hydrostatic pressure in the rock formations.

In accordance with the various embodiments, the drill string 806 may comprise various tools which create sensor data, such as LWD tool 826 and a MWD tool 828. The distinction between LWD and MWD is sometimes blurred in the industry, but for purposes of this specification and claims, LWD tools measure properties of the surrounding formation (e.g., porosity, permeability), and MWD tools measure properties associated with the borehole (e.g., inclination, and direction). The tools 826 and 828 may be coupled to a telemetry module 830 that transmits data to the surface. In some embodiments, the telemetry module 830 sends sensor data to the surface electromagnetically. In other cases, the telemetry module 830 sends sensor data to the surface by way of electrical or optical conductors embedded in the pipes that make up the drill string 806. In yet still other cases, the telemetry module 830 modulates a resistance to drilling fluid flow within the drill string to generate pressure pulses that propagate at the speed of sound of the drilling fluid to the surface, and where the sensor data is encoded in the pressure pulses.

Still referring to FIG. 8, in the illustrative case of sensor data encoded in pressure pulses that propagate to the surface, one or more transducers, such as transducers 832, 834 and/or 836, convert the pressure signal into electrical signals for a signal digitizer 838 (e.g., an analog to digital converter). Additional surface-based sensors creating sensor data (e.g., RPM measuring devices, drilling pressure measuring devices, mud pit level measuring devices) may also be present, but are not shown so as not to further complicate the figure. The digitizer 838 supplies a digital form of the many sensor measurements to a computer 840 or some other form of a data processing device. Computer 840 operates in accordance with software (which may be stored on a computer-readable storage medium) to process and decode the received signals, and to perform prediction of operational outcomes based on the models created as discussed above.

In accordance with at least some embodiments, at least a portion of the sensor data from the drilling operation is applied (by computer system 840) to the one or models and predictions of operational outcomes are made. The predictions may assist a driller in making changes and/or corrections to the drilling parameters, such as directional changes or changes to better control an operational outcome (e.g., changes of weight on bit to control ROP). In yet still other example embodiments, the surface computer 840 may gather sensor data and then forward the sensor data to another computer system 842, such as a computer system at the home office of the oilfield services provider, by way of remote connection. Using the sensor data, the computer system 842 may run the models to predict the operational outcome in the drilling operation, and provide the predicted operational outcome to the driller through the computer system 840. The communication of data between computer system 840 and computer system 842 may take any suitable form, such as over the Internet, by way of a local or wide area network, or as illustrated over a satellite 844 link.

The specification now turns to example operational techniques in which the various models created above may be used.

Operational Techniques

Figure 9:
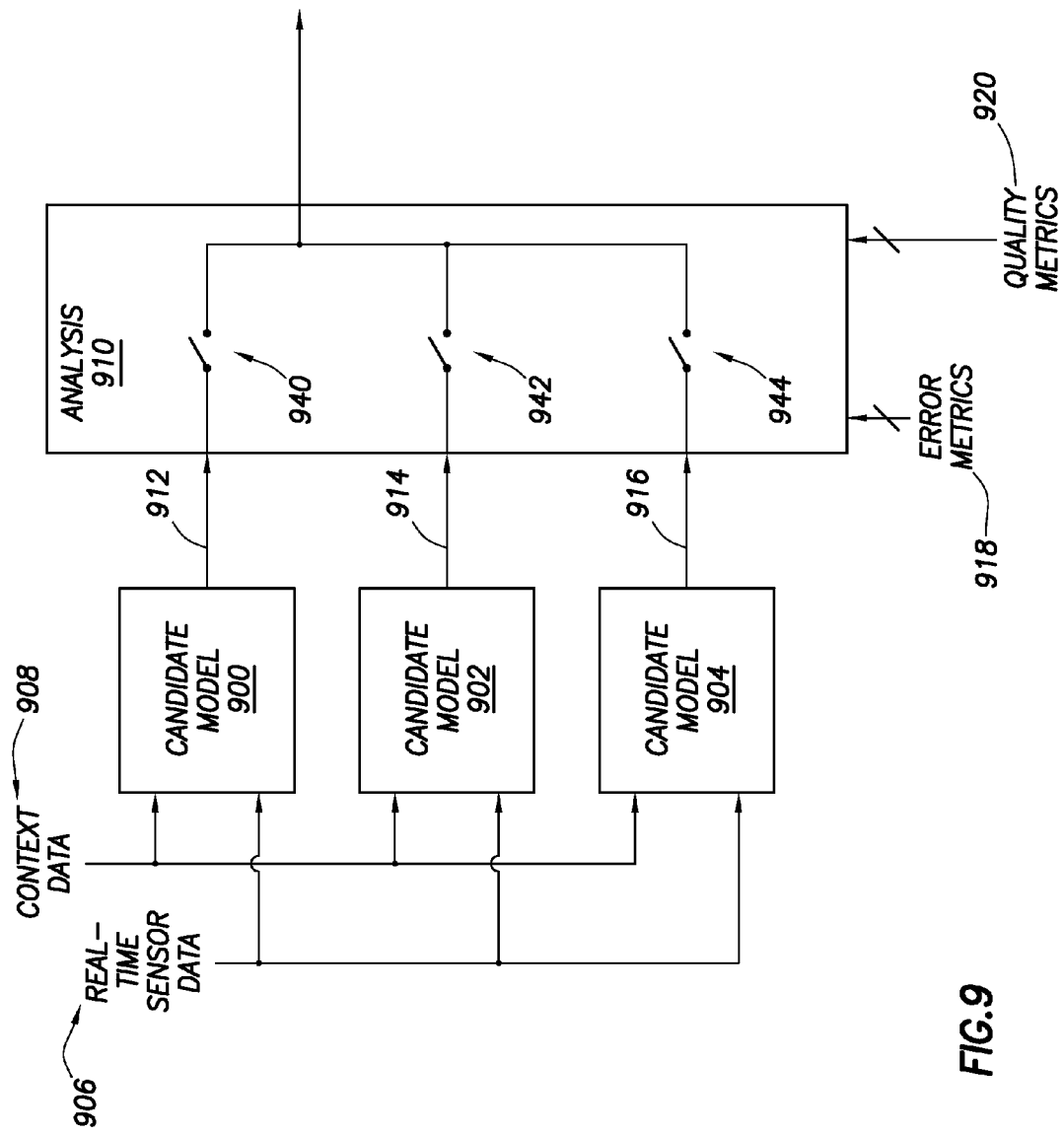
FIG. 9 shows, in block diagram form, logical operation of predictive portions in accordance with at least some embodiments.

FIG. 9 shows, in block diagram from, and example system of using models created in accordance with workflows discussed above. More particular, FIG. 9 shows an example technique regarding various models in the predictive aspects during drilling. In particular, FIG. 9 shows three candidate models 900, 902, and 904, though two or more candidate models may be used. These candidate models may be created according to the data analytics and model builder 102 workflow discussed above. In some cases, each candidate model is based on the same reduced data set; however, in other cases each candidate model may have been created based on differing reduced data sets. Regardless of the precise situation regarding creation of the candidate models, each candidate model is communicatively coupled to the real-time sensor data 906 and related context data 908. During drilling, each candidate model produces a predicted operational outcome, which operational outcome is communicatively coupled to an analysis engine 910, as shown by arrows 912, 914, and 916, respectively. Further, the analysis engine 910 may have access to other data that is helpful in evaluating the output of each candidate model, such as the error metrics 918 and quality metrics 920 regarding each candidate model as discussed above.

Using the predictive outputs, and possibly the further metrics, the analysis engine in the example embodiments selects one of the candidate models to be the active model for the prediction of the operational outcomes. In other words, in these example systems the analysis engine 910 performs the analysis, and acts as a multiplexer to select one candidate model to be the active model, and passes the prediction through the analysis engine 910 to be provided to the driller. For example, if candidate model 900 is selected, the logical switch 940 may be closed, while logical switches 942 and 944 may be opened. It is to be understood that there need not necessarily be a physical switch corresponding to switches 940, 942, and 944, as these functions are implemented in software either by way of the local computer system 840, the remote computer system 842, or a combination of the computer systems.

In some cases, a candidate model is selected and promoted to be the active model for the entire duration of the drilling process. However, in other example embodiments the candidate model selected may change with time/depth of the wellbore being drilled. For example, the candidate model 900 may be better at predicting the operational outcomes during certain times of the drilling process (e.g., during drilling of the vertical portion), and during such times the analysis engine may select the candidate model 900 to be the active model. However, candidate model 902 may be better at predicting the operational outcome during other times of the drilling process (e.g., during periods of time when the trajectory of the borehole is changing), and during such times the analysis engine may select the candidate model 902 to be the active model. Further still, candidate model 904 may be better at predicting the operational outcome during yet still other times of the drilling process (e.g., during periods of time when drilling trajectory is substantially horizontal), and during such times the analysis engine may select the candidate model 904 to be the active model.

In yet still other cases, the candidate models may be equivalent from the standpoint of the reduced data set used to train, test, and validate, and may all predict the same operational outcome during drilling. However, the analysis engine 910 may promote one model (e.g., candidate model 900) to the active model until such time as one or more error and/or quality metrics created in real-time with drilling indicate that the error is increasing and/or the quality of the prediction is decreasing. Simultaneously with the candidate model 900 being the active model, another model (e.g., candidate model 902) may be taken offline (i.e., not predicting the operational outcome), and instead the offline model may be placed in a training regimen using the real-time sensor data, the related context data, and the actual operational outcome of the drilling operation experienced. At the point in time when the error and/or quality metrics indicate the example candidate model 900 has surpassed a predetermined threshold, the candidate model 902 may be promoted to the active model, and the former active model may be placed back in the workflow for further training based on the sensor data and related context data applicable to the wellbore being drilled.

Figure 10:
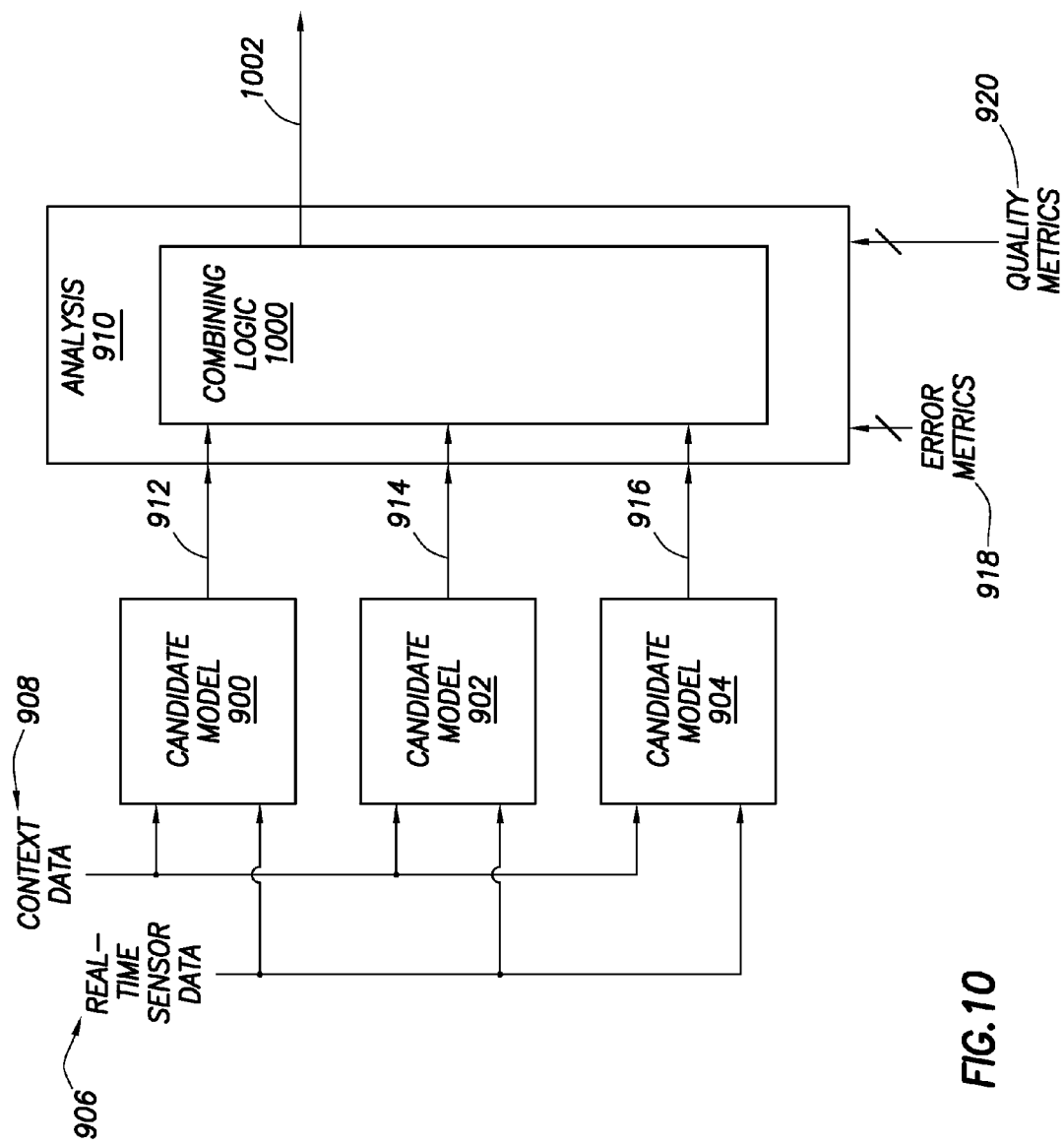
FIG. 10 shows, in block diagram form, logical operation of predictive portions in accordance with at least some embodiments.

FIG. 10 shows, in block diagram from, an alternative example system of using models created in accordance with workflows discussed above. More particular, FIG. 10 shows alternative example techniques regarding various models in the predictive aspects during drilling. In particular, FIG. 10 shows an equivalent operational set up to FIG. 9 in terms of communicative coupling of the candidate models, real-time sensor data, and the various error metrics. As with certain operational techniques discussed with respect to FIG. 9, in FIG. 10 during drilling each candidate model produces a predicted operational outcome. Unlike FIG. 9 where the predicted operational outcome is selected mutually exclusively from candidate models, FIG. 10 illustrates an operational philosophy where the predicted operational outcome is created by combining the predictive outputs of each candidate model.

In particular, within the analysis engine 910 of the example system a combining logic 1000 may be programmatically implemented. The combining logic 950 combines the predicted operational outcomes of each candidate model 900, 902 and 904 to produce a single predicted operational outcome 1002. In the case of predicted operational outcomes in the form of real numbers, the combining logic 950 combines in any suitable way, such as averaging, static weighted averaging based on the error/quality metrics (i.e., along the entire time/depth range of interest), and/or a dynamic weighted averaging that takes into account changes in the error/quality metrics for each candidate model as a function of time/depth.

In situations where the operational outcome to be predicted is a future Boolean event (e.g., future stuck pipe event), the predictions of the candidate models may also be combined in a static or dynamic weighted fashion to arrive at the Boolean prediction.

It is noted that the operational techniques discussed with respect to FIGS. 9 and 10 are not themselves mutually exclusive. In some cases groups of candidate models (e.g., each respective group of candidate models created based on the respective and distinct reduced data sets) may have their respective outputs combined in a fashion as described with the respect to FIG. 10, yet the analysis engine may select in a multiplexer fashion among the outputs created by respective combining logics 1000.

The end result is a predicted operational outcome provided to a driller, where the driller can then make changes a drilling parameter based on the prediction(s).

Implementation Considerations

Figure 11:
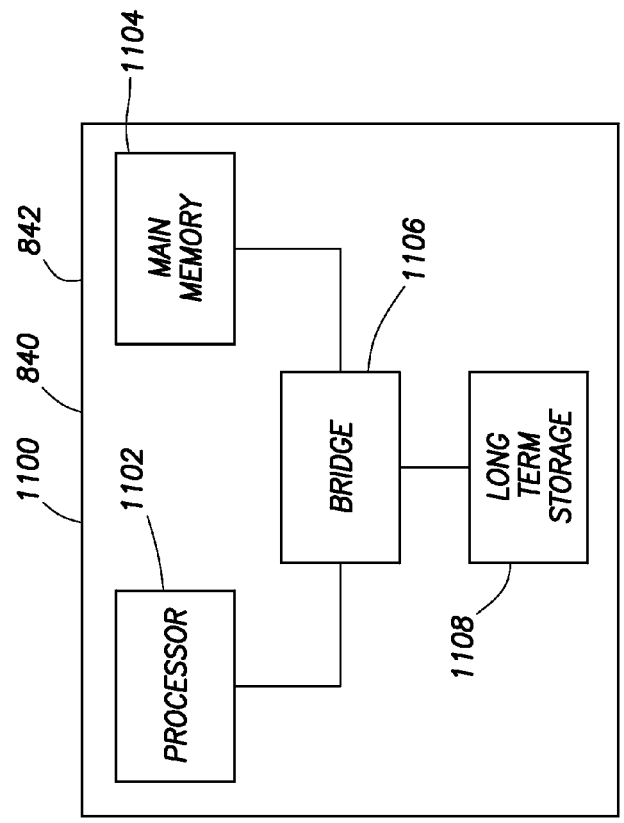
FIG. 11 shows, in block diagram form, a computer system in accordance with at least some embodiments.

FIG. 11 shows a computer system 1100, which is illustrative of a computer system upon which any of the various embodiments, or portions thereof, may be practiced. The computer system 1100 may be illustrative of, for example, computer system 840 or 842. In particular, computer system 1100 comprises a processor 1102, and the processor couples to a main memory 1104 by way of a bridge device 1106. Moreover, the processor 1102 may couple to a long term storage device 1108 (e.g., a hard drive, solid state disk, memory stick, optical disc) by way of the bridge device 1106. Programs executable by the processor 1102 may be stored on the storage device 1108, and accessed when needed by the processor 1102. The programs stored on the storage device 1108 may comprise programs to implement the various embodiments of the present specification, such as those shown in FIG. 1. In some cases, the programs are copied from the storage device 1108 to the main memory 1104, and the programs are executed from the main memory 1104. Thus, the main memory 1104, and storage device 1108 shall be considered computer-readable storage mediums.

Figure 12:
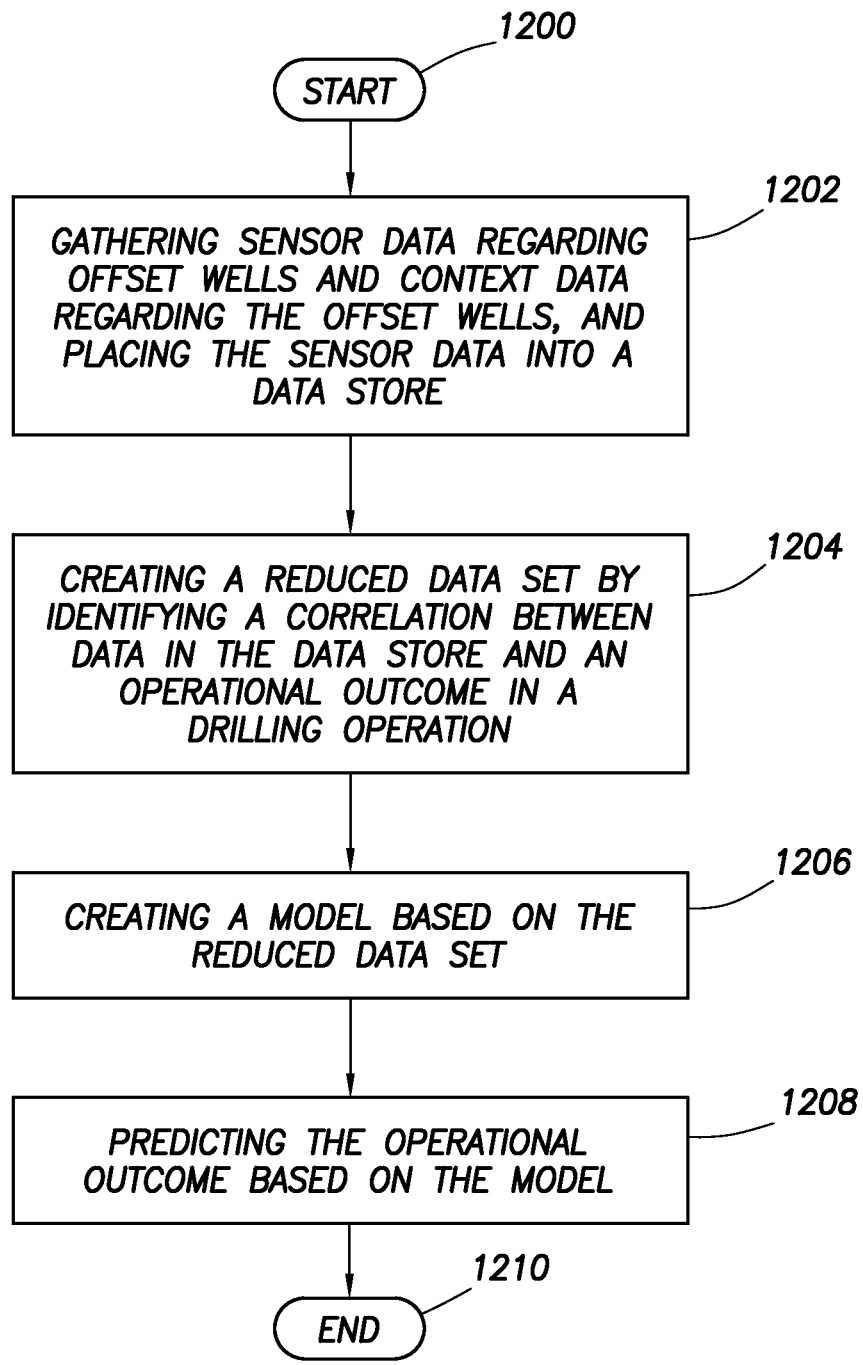
FIG. 12 a flow diagram in accordance with at least some embodiments.

FIG. 12 shows a method (some of which may be performed as a program) in accordance with at least some embodiments. In particular, the method starts (block 1200) and comprises: gathering sensor data regarding offset wells and context data regarding the offset wells, and placing the sensor data and context data into a data store (block 1202); creating a reduced data set by identifying a correlation between data in the data store and an operational outcome in a drilling operation (block 1204); creating a model based on the reduced data set (block 1206); and predicting the operational outcome based on the model (block 1208). In some cases, the example method may be immediately restated.

It is noted that while theoretically possible to perform some or all the calculations, clustering, data analysis, and/or modeling by a human using only pencil and paper, the time measurements for human-based performance of such tasks may range from man-years to man-decades, if not more. Thus, this paragraph shall serve as support for any claim limitation now existing, or later added, setting forth that the period of time to perform any task described herein less than the time required to perform the task by hand, less than half the time to perform the task by hand, and less than one quarter of the time to perform the task by hand, where "by hand" shall refer to performing the work using exclusively pencil and paper.

From the description provided herein, those skilled in the art are readily able to combine the methods described above in the form of software with appropriate general purpose or special purpose computer hardware to create a computer system and/or computer subcomponents embodying the invention, to create a computer system and/or computer subcomponents for carrying out the method of the invention, and/or to create a non-transitory computer-readable media (i.e., not a carrier wave) for storing a software program to implement the method aspects of the invention.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

At least some of the illustrative embodiments are methods including: gathering sensor data regarding offset wells and context data regarding the offset wells, and placing the sensor data and context data into a data store; creating a reduced data set by identifying a correlation between data in the data store and an operational outcome in a drilling operation; creating a model based on the reduced data set; and predicting the operational outcome based on the model.

The predicting of the method may further comprise predicting the operational outcome prior to the drilling operation.

The changing of the method may further comprise changing a planned drilling parameter based on predicting the operational outcome.

The method may further comprise: a method where gathering further comprises gathering real-time sensor data and context data regarding a wellbore during the drilling operation of the wellbore; and a method where predicting further comprises predicting future values of the operational outcome during the drilling operation of the wellbore.

The method may further comprise changing a drilling parameter responsive to the future values of the operational outcome.

Creating the reduced data set of the method may further comprise: reading a multidimensional data structure from at least a portion of the data store; identifying the correlation between portions of the sensor data and portions of the context data in the multidimensional data structure, the correlation predictive of the operational outcome, and the correlation not selected in advance of the identifying; and segmenting the multidimensional data structure to produce the reduced data set.

The segmenting of the method may further comprise segmenting by a machine learning algorithm.

The segmenting by a machine learning algorithm may further comprise creating a training data set based on the correlation; and training the machine learning algorithm using the training data set.

The method may further comprise performing data cleansing on the reduced data set.

The method may comprise: a method where creating the model further comprises creating a first candidate model and a second candidate model; and where predicting the operation parameter further comprises: predicting the operational outcome using the first candidate model, thereby creating a first prediction; predicting the operational outcome using the second candidate model, thereby creating a second prediction; and selecting between the first prediction and the second prediction based on an error indication of each prediction.

The predicting of the method may further comprise predicting at least one event from the group consisting of: stuck pipe event; and excess deviation of drilling direction.

Other illustrative embodiments are computer systems comprising: a processor; a memory coupled to the processor; and a display device coupled to the processor. The memory stores a program that, when executed by the processor, causes the processor to: gather sensor data regarding offset wells and context data regarding the offset wells, and place the sensor data and context data into a data store; create a reduced data set by identification of a correlation between data in the data store and an operational outcome in a drilling operation; create at least one a model based on the reduced data set; and predict the operational outcome based on the at least one model.

In the computer system, when the processor predicts, the program causes the processor to predict the operational outcome prior to the drilling operation.

In computer system, the program further causes the processor to at least one selected from the group consisting of: change a planned drilling parameter based on predicting the operational outcome; and change a drilling parameter during drilling, the change based on prediction of the operational outcome.

In the computer system: when the processor gathers, the program further causes the processor to gather real-time sensor data and context data regarding a wellbore during the drilling operation of the wellbore; and when the processor predicts, the program further causes the processor to predict future values of the operational outcome during the drilling operation of the wellbore.

In the computer system the program further causes the processor to change a drilling parameter responsive to the future values of the operational outcome.

In the computer system, when the processor creates the reduced data, the program causes the processor to: read a multidimensional data structure from at least a portion of the data store; identify the correlation between portions of the sensor data and portions of the context data in the multidimensional data structure, the correlation predictive of the operational outcome, and the correlation not selected in advance of the identifying; and segment the multidimensional data structure to produce the reduced data set.

In the computer system the program further causes the processor to perform data cleansing on the reduced data set.

In the computer system, when the processor predicts, the program causes the processor to predict the future occurrence of at least one event from the group consisting of: stuck pipe event; and excess deviation of drilling direction.

What is claimed is:

1. A computer-implemented method comprising:
   gathering sensor data regarding offset wells, based on measurements by one or more physical sensors associated with a drilling operation;
   gathering context data regarding the offset wells, the context data relating to aspects of the drilling operation that are not based on measurements by physical sensors associated with the drilling operation;
   placing the sensor data and the context data into a data store;
   creating a reduced data set by identifying a correlation between the sensor data and the context data in the data store, wherein the correlation is predictive of an operational outcome of the drilling operation, and the correlation is identified without preselected distance measures;
   creating a model based on the reduced data set;
   predicting the operational outcome based on the model;
   adjusting at least one drilling parameter for the drilling operation, based on the predicted operational outcome; and
   drilling a wellbore through a formation based on the at least one adjusted drilling parameter.

2. The method of claim 1 wherein predicting further comprises predicting the operational outcome prior to the drilling operation.

3. The method of claim 2 wherein the at least one drilling parameter is selected from the group consisting of: a weight on bit; a drilling fluid pressure; a drilling direction; a rotational speed of a drill string within the wellbore; and rotational speed of the drill bit as turned by a downhole motor.

4. The method of claim 1 wherein:
   gathering further comprises gathering real-time sensor data and context data regarding the wellbore as it is being drilled during the drilling operation; and
   predicting further comprises predicting future values of the operational outcome during the drilling operation, based on the real-time sensor data and context data.

5. The method of claim 4 wherein the at least one drilling parameter is further adjusted responsive to the future values of the operational outcome.

6. The method of claim 1 wherein creating the reduced data set further comprises:
   reading a multidimensional data structure from at least a portion of the data store;
   identifying the correlation between portions of the sensor data and portions of the context data in the multidimensional data structure, the correlation predictive of the operational outcome, and the correlation not selected in advance of the identifying; and
   segmenting the multidimensional data structure to produce the reduced data set.

7. The method of claim 6 wherein segmenting further comprises segmenting by a machine learning algorithm.

8. The method of claim 7 wherein segmenting by the machine learning algorithm further comprises:
   creating a training data set based on the correlation; and
   training the machine learning algorithm using the training data set.

9. The method of claim 6 further comprising performing data cleansing on the reduced data set.

10. The method of claim 1 further comprising:
    wherein creating the model further comprises creating a first candidate model and a second candidate model;
    wherein predicting the operational outcome further comprises:
    predicting the operational outcome using the first candidate model, thereby creating a first prediction;
    predicting the operational outcome using the second candidate model, thereby creating a second prediction; and
    selecting between the first prediction and the second prediction based on an error indication of each prediction.

11. The method of claim 1 wherein predicting further comprises predicting at least one event from the group consisting of: stuck pipe event; and excess deviation of drilling direction.

12. A computer system comprising:
    a processor;
    a memory coupled to the processor; and
    a display device coupled to the processor,
    wherein the memory stores a program that, when executed by the processor, causes the processor to:
    gather sensor data regarding offset wells, based on measurements by one or more physical sensors associated with a drilling operation;
    gather context data regarding the offset wells, the context data relating to aspects of the drilling operation that are not based on measurements by physical sensors associated with the drilling operation;
    place the sensor data and the context data into a data store;
    create a reduced data set by identification of a correlation between the sensor data and the context data in the data store, wherein the correlation is predictive of an operational outcome of the drilling operation, and the correlation is identified without preselected distance measures;

create at least one a model based on the reduced data set;

predict the operational outcome based on the at least one model;

adjust at least one drilling parameter for the drilling operation, based on the predicted operational outcome; and drill a wellbore through a formation based on the at least one adjusted drilling parameter.

13. The computer system of claim 12 wherein when the processor predicts, the program causes the processor to predict the operational outcome prior to the drilling operation.

14. The computer system of claim 13 wherein the at least one drilling parameter is selected from the group consisting of: a weight on bit; a drilling fluid pressure; a drilling direction; a rotational speed of a drill string within the wellbore; and rotational speed of the drill bit as turned by a downhole motor.

15. The computer system of claim 12 wherein the program further causes the processor to:

gather real-time sensor data and context data regarding the wellbore as it is being drilled during the drilling operation; and predict future values of the operational outcome during the drilling operation, based on the real-time sensor data and context data.

16. The computer system of claim 15 wherein the at least one drilling parameter is further adjusted responsive to the future values of the operational outcome.

17. The computer system of claim 12 wherein when the processor creates the reduced data, the program causes the processor to:

read a multidimensional data structure from at least a portion of the data store;

identify the correlation between portions of the sensor data and portions of the context data in the multidimensional data structure, the correlation predictive of the operational outcome, and the correlation not selected in advance of the identifying; and segment the multidimensional data structure to produce the reduced data set.

18. The computer system of claim 17 wherein the program further causes the processor to perform data cleansing on the reduced data set.

19. The computer system of claim 12 wherein when the processor predicts, the program causes the processor to predict the future occurrence of at least one event from the group consisting of: stuck pipe event; and excess deviation of drilling direction.

20. A non-transitory computer-readable medium storing a program that, when executed by processor, causes the processor to:

gather sensor data regarding offset wells, based on measurements by one or more physical sensors associated with a drilling operation;

gather context data regarding the offset wells, the context data relating to aspects of the drilling operation that are not based on measurements by physical sensors associated with the drilling operation;

place the sensor data and the context data into a data store;

create a reduced data set by identification of a correlation between the sensor data and the context data in the data store, wherein the correlation is predictive of an operational outcome of the drilling operation, and the correlation is identified without preselected distance measures;

create at least one a model based on the reduced data set;

predict the operational outcome based on the at least one model;

adjust at least one drilling parameter for the drilling operation, based on the predicted operational outcome; and drill a wellbore through a formation based on the at least one adjusted drilling parameter.

21. The non-transitory computer-readable medium of claim 20 wherein when the processor predicts, the program causes the processor to predict the operational outcome prior to the drilling operation.

22. The non-transitory computer-readable medium of claim 21 wherein the at least one drilling parameter is selected from the group consisting of: a weight on bit; a drilling fluid pressure; a drilling direction; a rotational speed of a drill string within the wellbore; and rotational speed of the drill bit as turned by a downhole motor.

23. The non-transitory computer-readable medium of claim 20 wherein the program further causes the processor to:

gather real-time sensor data and context data regarding the wellbore as it is being drilled during the drilling operation; and predict future values of the operational outcome during the drilling operation, based on the real-time sensor data and context data.

24. The non-transitory computer-readable medium of claim 23 wherein the at least one drilling parameter is further adjusted responsive to the future values of the operational outcome.

25. The non-transitory computer-readable medium of claim 20 wherein when the processor creates the reduced data, the program causes the processor to:

read a multidimensional data structure from at least a portion of the data store;

identify the correlation between portions of the sensor data and portions of the context data in the multidimensional data structure, the correlation predictive of the operational outcome, and the correlation not selected in advance of the identifying; and segment the multidimensional data structure to produce the reduced data set.

26. The non-transitory computer-readable medium of claim 25 wherein the program further causes the processor to perform data cleansing on the reduced data set.

27. The non-transitory computer-readable medium of claim 20 wherein when the processor predicts, the program causes the processor to predict the future occurrence of at least one event from the group consisting of: stuck pipe event; and excess deviation of drilling direction.

* * * * *